United States Patent [19]
Yoshikawa

[11] Patent Number: 5,247,455
[45] Date of Patent: Sep. 21, 1993

[54] METHOD OF VERIFYING WIRING LAYOUT

[75] Inventor: Hajime Yoshikawa, Fujiidera, Japan

[73] Assignee: Sharp Kabushiki Kaisha, Osaka, Japan

[21] Appl. No.: 707,020

[22] Filed: May 29, 1991

[30] Foreign Application Priority Data

May 30, 1990 [JP] Japan ................................. 2-141929

[51] Int. Cl.$^5$ ............................................. G06F 15/60
[52] U.S. Cl. ..................................... 364/490; 364/489; 364/488
[58] Field of Search ................. 364/488, 489, 490, 491

[56] References Cited

U.S. PATENT DOCUMENTS

| | | | |
|---|---|---|---|
| 3,681,782 | 8/1972 | Scanlon | 364/491 |
| 4,541,114 | 9/1985 | Rutenbar et al. | 364/491 |
| 4,852,015 | 7/1989 | Doyle, Jr. | 364/491 |
| 4,858,143 | 8/1989 | Fournier | 364/491 |
| 4,903,214 | 2/1990 | Hiwatashi | 364/491 |

Primary Examiner—Vincent N. Trans

[57] ABSTRACT

A method of verifying wiring layouts including the steps of preparing a first reference value representing the minimum required distance between each combination of two arbitrary kinds of wiring elements; preparing a second reference value representing the minimum required distance between the two straight wirings in a prescribed positional relation (parallel to each other, for instance); extracting two arbitrary wiring elements from the layout data; determining the combination of the kinds of the two wiring elements extracted; determining whether the two straight wirings are in a predetermined positional relation if the two wiring elements are both determined to be straight wirings; determining whether a predetermined relation is established between the first or the second reference value and the distance between the extracted wiring elements by comparing the distance between the extracted two wiring elements with the first reference value if the two wiring elements are determined to be straight wirings in a predetermined positional relation, and otherwise by comparing with the first reference value; and displaying information for specifying the two wiring elements if it is determined that the predetermined relation is established.

12 Claims, 8 Drawing Sheets

METHOD OF VERIFYING WIRING LAYOUT

BACKGROUND OF THE INVENTION

1. Field of the Invention

The present invention relates generally to a method of verifying wiring layout of printed wiring boards, etc. by Computer Aided Design (referred to as "CAD" hereinafter), and more particularly to a method of verifying wiring layout which is capable of increasing the yield of high-density printed wiring boards.

2. Description of the Related Art

Because large-scale and complex circuits is greatly aided by computer, CAD is largely employed for circuit design for its accuracy and high processing speed.

A detailed description will now be provided on a standard process of a design system using CAD for each process in the numerical order shown in FIG. 1.

(1) Based on a circuit layout, an operator inputs graphic data into a large computer or a graphic work-station using a digitizer and a graphic display, to produce the data-base of the circuit layout. The data base includes the coded graphic data and/or image data.

(2) The large size computer automatically transforms the graphic data of the circuit layout stored inside into image data.

(3) The operator places arbitrarily desired parts to be loaded, e.g. connectors etc., using the circuit layout data. This computer performs an initial placing of other parts. The initial placement involves placing parts in prescribed positions on a screen upon the initiation of an operation. Several kinds of operations are known for the method of placement. In one method, parts are initially placed outside the contour of a board on the screen. Each part will be moved later manually to an appropriate position inside the contour of the board. In another method, parts are initially placed inside the contour of a board, in positions determined by optimizing of wiring lengths.

(4) The result of the initial placement is displayed on the graphic display. The logic connection between the parts are displayed in a form of rat's nests. A rat's nest is a group of lines connecting the initially placed parts. Because these straight lines are drawn without taking into account the positional relations between the parts, they look like a rat's nest from which this name is derived.

(5) The operator examines the rat's nest to evaluate the wiring. If there parts yet to be loaded still exist the parts are manually placed. Also, if there exists a portion of wiring, which is too long, or a portion in which rat's nests are too concentrated, the operator changes the position of the parts to improve the placement. Based on the information related to the changes, the rat's nest after the improvement is produced and is once again displayed. After repeating this operation several times, an optimum placement of the parts will be obtained.

A wiring, which is too long, may cause a signal delay or the influence of noises, which is significant to ignore, when the wiring is for transmitting high frequencies high frequency clock pulses or is used for a ground line. This is the reason why the wiring length is verified.

If there a portion exists in which wirings are overconcentrated, it is highly possible that the pattern development in that portion will be difficult at a later time. The existence of such a portion is checked in order to prevent the above-mentioned problem.

(6) After the placement of the parts is decided, pin allocation advantageous for patterning is automatically executed by computer programs. In this allocation, a library having the data for the parts, which have been previously registered, is searched to find out circuit blocks or pins replaceable by the registered circuit blocks or pins, and the replaceable blocks or pins are replaced by the corresponding blocks respectively, so that the allocation is carried out for facilitating wirings as much as possible.

(7) The results of the placement and the pin allocation are fed back to the graphic data of the circuit layout. Thus, the circuit layout is automatically completed, in which the characters of the parts, the placement locations, the pin numbers, etc. are decided.

(8) A description will be given next on the designing of a conductor pattern. "IC packaging ratio", and "wiring accommodation ratio" are calculated by the following equations:

IC packaging ratio = the number of IC packaged board areas; and wiring accommodation ratio = total wiring length/board area.

It should be noted that the above two equations are basic equations, and minor changes may be made.

The operator determines which method of wiring, is to be employed in deciding the conductor from the methods of interactive automatic wiring, batch type automatic wiring, and manual wiring. The determination is made based on the operator's knowledge empirically acquired.

(9) The terminal positions of the parts, i.e. the positions of through-holes are produced by a pen plotter on a sheet of plotting paper ruled into 1-inch squares.

(10) A "from-to list" is output by the computer. The operator manually designs the conductor pattern by referring to the from-to list. The from-to list indicates to which pin of which part that each of the pins of all of the packaged parts of each net is connected. The "net" on the from-to list is a group of parts including parts connected by one conductor as a circuit.

(11) The operator digitizes via holes and the conductor pattern, to produce pattern data.

(12) The operator inputs the digitized pattern data, the circuit layout and the data of the packaged parts into the large computer or the graphic work-station. The CAD on the large computer checks as to whether the conductor pattern is correct and whether the conductor spacing is appropriate. The present invention is directed to an improvement of the checking of the conductor spacing, and a detailed description thereof will follow.

(13) After the checking, a modification operation is performed if necessary.

(14) A pattern layout and a parts assembly layout for manufacturing management.

(15) The computer outputs data required at the division of manufacturing printed wiring boards, printed wiring board manufacturing data, CAM (Computer Aided Manufacturing) interface data, EDP (Electronic Data Processing) interface data (list), etc. The output data are transferred to the manufacturing division of the printed wiring board as well as to the manufacturing division of devices.

Automatic wiring can be automatically performed by the CAD. By the aid of the CAD it is far easier to design circuits as compared to the case in which the entire design is carried out manually.

Knowledge of manually available wiring techniques are not entirely implemented by the automatic wiring programs. Human ability is still superior to that of the automatic wiring programs, in optimizing circuit wiring details, and in adding wirings onto a high-density printed wiring board, etc. Most of the layout design systems of printed wiring boards by the CAD employ both automatic wiring and manual wiring.

When inputting the data of wiring into the CAD system, the operator inputs the data using a keyboard watching an image on a CRT (Cathode Ray Tube), or using a digitizer. If wiring is manually performed as described above, however, it is generally unavoidable that, for example, erroneous data is input, or input data includes measuring error's. It is therefore necessary to strictly verify such manually produced design data.

In the automatic wiring programs, the wiring layout is performed in accordance with predetermined rules. Therefore, it seems to be unnecessary to strictly check the resultant design data by this automatic wiring program. Even in the case of the automatic wiring, however, checking is necessary because the conductor pattern is manually modified, as described above, in order to add interconnections to be wired or to change the design.

Visual checking is principally possible, but as wiring density is increased in recent printed wiring boards, it is extremely difficult to find out errors in physical requirements such as conductor spacings from the conductor pattern produced by a plotter.

Areas in which wiring is prohibited etc. tend to be overlooked in the case of manual checking. Presently, automatic checking by a computer is therefore indispensable in designing printed wiring boards.

As described above, a prescribed requirement should be met for conductor spacing. Such a requirement is imposed for the following reasons.

Manufacturing circuits in practice are processed by chemical or mechanical operations such as etching, drilling, etc. If the conductor spacing is too narrow, it is highly possible that adjacent portions to be etched are erroneously connected with each other upon etching, thereby causing short circuit defects in the products. Also, if a center axis is shifted when drilling is performed, adjacent wirings may be erroneously disconnected. In other words, it is necessary to secure the conductor spacing at more than a prescribed length, because the yield of the products should be kept at a prescribed percentage.

It is also necessary to provide a prescribed space between, for example, a power supply circuit liable to generate noises and other circuits, or between right-channel and left-channel voice sound processing circuits in a stereo system. Regions considered to become easily affected by noise after the assembly are desirably excluded from pattern formation. This also imposes physical requirements such as conductor spacings on the wiring layout design.

Another reason for performing automatic checking is that a large amount of integrity of data is expected in processing the data by CAD when the circuit design is manually performed without computer as in the process of art working. As is well known, by the CAD, the placement of each part and wiring is defined by each lattice point of a basic lattice, and a placement between the lattice points which is not on the lattice points, is prohibited. On the other hand, in the process of art working, the original picture of wirings is produced manually. This operation is of an analog type, and even if an underlying sheet, etc. which corresponds to the basic lattice of the CAD is used in the operation, a violation of the rules when wiring is a high possibility. It is impossible to obtain an actual dimension if the conductor pattern data includes such a violation of the wiring specification. It is therefore necessary to check physical requirements such as conductor spacings, etc.

The spacing required for a proximity entity of a printed wiring board checked by the CAD was formally performed by a method of comparing a sole acceptable spacing value to be a reference and each of the entire data. Recently, a clearance value is separately provided for each kind of data to be checked, and is compared to data each corresponding thereto. The latter method is employed in accordance with the former method, because when considering all of the combinations of the data, the safest, i.e. the largest value is set to be a clearance value, and, therefore, parts which can otherwise be placed more closely to each other may be at a distance from each other which is more than necessary. By changing clearance values depending upon the kinds of the parts to be checked as in the latter method, a distance between the parts will not be unnecessarily great so that the wiring density of printed wiring boards is increased.

The following six kinds of clearance values are provided when, for example, data of three kinds, i.e. line, land, and through-hole, exist.

FIGS. 2 to 7 are diagrams each showing a display example by the CAD.

FIG. 2 is a diagram showing how a line-line (between two lines) spacing distance is verified. FIG. 3 is a diagram showing how a line-land (between a line and a land) spacing distance is verified. FIG. 4 is a diagram showing how a line-through-hole (between a line and a through-hole) spacing distance is verified. FIG. 5 is a diagram showing how a land-land (between two lands) spacing distance is verified. FIG. 6 is a diagram showing how a land-through-hole (between a land and a through-hole) spacing distance is verified. FIG. 7 is a diagram showing how a through-hole-through-hole (between two through-holes) spacing distance is checked.

Now, referring to FIGS. 2 to 7, the following required clearance values are employed: a predetermined distance A between line 1 and line 1; a predetermined distance B between line 1 and line 2; a predetermined distance C between line 1 and through-hole 3; a predetermined distance D between lands 2; a predetermined distance E between land 2 and through-hole 3; and a predetermined distance F between through-holes 3.

As mentioned above, conventionally, a clearance to be checked is previously provided for each kind of data, and checking suitable for each of the processes such as etching, drilling, etc. in the manufacturing process of the printed wiring boards is conducted with respect to the wiring data so as to achieve high density wirings.

The above-mentioned conventional method, however, includes the following critical shortcomings. One typical example of the problems is shown in FIG. 8. Referring to FIG. 8, lines 1a and 1b are parallel to each other. At the right of the line 1b is a land 2 (or a through-hole 3), and at the right of the land 2 (or the through-hole 3) is a line 1c having the same width as the diameter of the land 2 (or the through-hole 3), extending away from the line 1b in the direction orthogonal to the line 1b. Such a placement occurs often.

In the following discussion, it is assumed that a clearance value B (or C) between line-land (or line-through-hole) is selected to be smaller than a clearance value A between line-land. Referring to FIG. 8, the distance between the line 1a and 1b can be verified without any problem by using the distance A as a reference. The following problems, however, arise in checking the line 1b and a line 1c.

The end of the line 1c on the side of the line 1b overlaps the land 2 (or the through-hole 3). The distance used between the land 2 and the line 1b, should be a distance just more than B (or C) to be adequate. The distance between the line 1c and 1b is however taken for the distance between the line 1b and the land 2 (or the through-hole 3) by a determination in accordance with programs for checking spacings, because the end of the line 1c overlaps the land 2 (or the through-hole 3). Because the relation B <A holds as described above, if the distance between the land 2 and the line 1b is selected to be close to the clearance value B, the distance between the line 1c and the line 1b (=B) will be smaller than A, and, therefore, it is determined by the program that the line 1c and the line 1b are placed too close to each other. In other words, it is determined that the placement of the line 1b and the line 1c is an error.

The positional relation between the lines 1c and 1b can sufficiently be checked as a line-land relation taking into account the manufacturing process, etc., as far as the line 1b and the line 1c are placed in accordance with the relation as shown in FIG. 8. In other words, it is sufficient for the distance between the land 2 and the line 1b to be larger than the distance B.

In practice, however, the layout is determined to be an error as described above. Such errors take place in a number of places in a circuit layout, and, therefore, it will be impossible for the operator to cope with real errors which must be dealt with carefully. Thereby, it is hard to design without making errors.

A similar problem can take place between a line 1b, a land 2 (or a through-hole 3) which are reinforced by a tapering processing, and a line 1a. The tapering processing is applied in order to prevent disconnections, etc. due to the shift of the center axis, when a portion is drilled to form a hole after, for example, a pattern formation. In other words, without the tapering portion, the land 2 (or the through hole 3) is cut off from the line 1b by a drilled hole 4, when the drilled hole 4 is formed slightly shifted as shown in FIG. 10. On the other hand, as shown in FIG. 1, with the tapering processing is applied, a disconnection will not take place even if the drilled hole 4 is slightly shifted.

Now, referring back to FIG. 9, when the distance between the line 1a and the line 1b is checked, the distance between the land 2 (or the through hole 3) and the line 1a is determined to be the closest distance between the line 1a and 1b, which is smaller than the reference spacing value A between line-line, by the spacing checking programs, because the tapering portion of the line 1b overlaps the land 2 (or the through hole 3). The wiring layout is determined to be an error in the portion. However, the portion is large enough if determined by taking the reference spacing value B between line - land as a reference, and also, the error of the wiring layout in that portion should be canceled by so doing.

Conventional methods of checking spacing however do not have such a capability of making distinctions as described above. In the example shown in FIG. 8, the spacing checking between the land 2 (the through-hole 3) and the line 1b as well as the spacing checking between the line 1c and the line 1b are made by taking the same clearance value as a reference after all. In a printed wiring board as described above, in which a line-line clearance is smaller than a line-land (or through-hole) clearance, if checking is made by taking the line-land clearance as a reference, the line-line clearance will be an error. On the other hand, if the line-line clearance is taken as a reference, the line-land clearance will be determined to be unnecessarily large.

In a printed wiring board in which a line-land (or through-hole) clearance is smaller than a line-line clearance, a line-land (or a through-hole) distance will be an error by taking the line-line clearance as a reference. On the other hand, a line-line distance will be unnecessarily large if the line-land clearance is taken as a reference.

In other words, in accordance with the conventional method, placements including those which are not inherent may be determined to be errors and a large number of errors to be displayed results, so that it would be practically impossible to find out true errors from those errors displayed at that time and to cope with them. Otherwise, a distance between wirings should be enlarged more than necessary in order to eliminate undeserved errors to be displayed, so that high density wirings cannot be obtained.

SUMMARY OF THE INVENTION

It is therefore an object of the present invention to provide a method of verifying a wiring layout by which a conductor pattern can be accurately examined as to its clearance.

Another object of the present invention is to provide a method of verifying a wiring layout by which true errors can be readily and accurately discovered.

Yet another object of the present invention is to provide a method of verifying a wiring layout by which only true errors can be discovered readily and accurately without displaying fails errors.

An additional object of the present invention is to provide a method of verifying a wiring layout by which errors can be readily and accurately discovered without degrading the wiring density.

A method of verifying a wiring layout in accordance with the present invention includes the steps of: preparing wiring layout data which may include wiring elements of a plurality of kinds including straight wirings; preparing a first reference value representing a minimum required distance between each combination of two arbitrary kinds of wiring elements; preparing a second reference value representing a minimum required distance between two straight wirings in a predetermined positional relation in a layout; extracting two arbitrary wiring elements from the wiring layout data; determining the combination of the kinds of the extracted two wiring elements in a first determining step; determining as to whether the extracted two straight wirings are in the predetermined positional relation in the layout in a second determining step if the extracted two wiring elements are both determined to be straight wirings depending upon the first determining step; determining as to whether the predetermined relation is established between the first or the second reference value and the distance between the extracted two wiring elements in a third determining step by comparing the distance between the extracted two wiring elements and the second reference value if the two wiring elements extracted in the second determining step are in the predetermined positional relation with each other, and otherwise by comparing the first reference value and the distance between the extracted two wiring elements; and displaying information to specify the extracted two wiring elements if it is determined in the third determining step that the predetermined relation is established.

In the above-described method of verifying wiring layouts, two arbitrary wiring elements included in the wiring layout data are extracted, and it is determined what combination of the kinds of the extracted wiring elements are formed. In the case where the extracted two wiring elements are both straight wirings, it is determined whether these straight wirings are in a predetermined positional relation. Then, if the extracted wiring elements are both straight wirings as well as in the predetermined positional relation with each other, a comparison is made between the second reference value and the distance between the wiring elements, and otherwise between the first reference value and the distance between the wiring elements. If the result of the comparison shows that the predetermined relation is established between the compared values, information to specify the extracted two wiring elements will be displayed in the displaying step.

If the wiring elements to be compared are both straight wirings, reference values different from other cases are employed when a certain positional relation is established between these wirings. Accordingly, the wiring layout can be verified under the most preferable conditions when the two straight wirings are in the certain positional relation and otherwise.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 12:
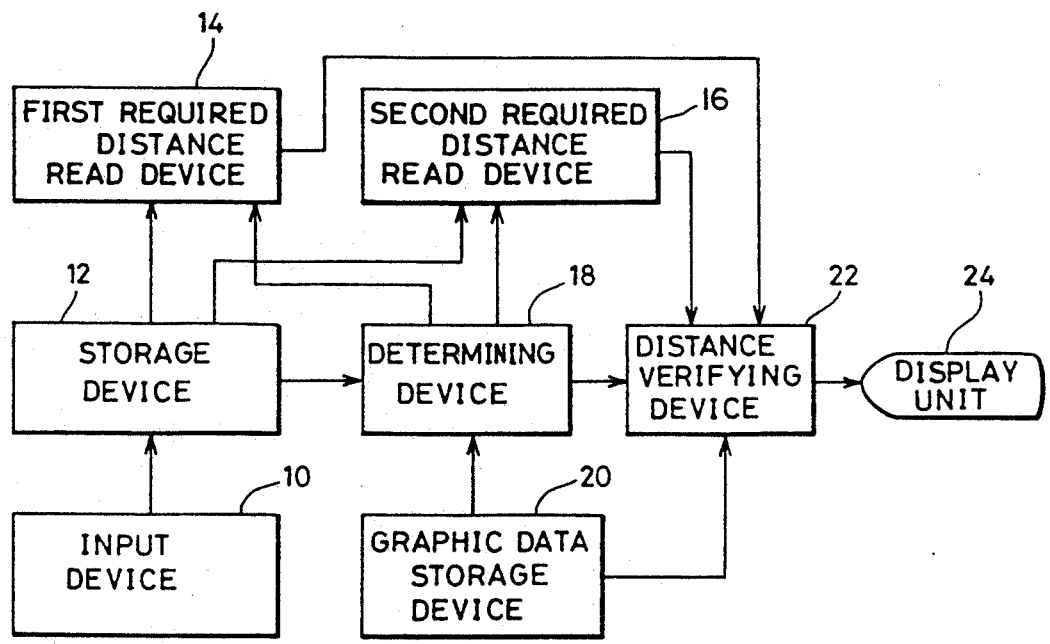
FIG. 12 is a concept diagram showing functional modules structuring a device for an embodiment of the present invention.

An apparatus for an embodiment of the present invention utilizes a computer as an aid for designing, and a conceptional combination of functional units incorporated therein is shown in FIG. 12.

Referring to FIG. 12, the apparatus includes an input device 10 including a keyboard, a digitizer and the like to which an operator inputs graphic data, commands etc., and a storage device 12 for storing data applied to the input devices 10. The storage device 12 includes an area for storing a first required distance to be used as a reference in checking a distance between two parallel straight lines, an area for storing a second required distance to be used is a reference in checking a distance between two straight lines which are not parallel to each other, and an area for storing required distances to be used for combinations of the other parts.

The apparatus in FIG. 12 further includes a graphic data storage device 20 for storing graphic data including wiring elements to be checked; a determining device 18 for extracting two wiring elements to be checked from the data stored in the graphic data storage device 20, to determine whether these two are straight lines parallel to each other or not; a first required distance reading device 14 responsive to a result of determination by the determining device 18 for reading out a first required distance from the storage device 12 if the two wirings are parallel to each other; a second required distance reading device 16 for reading out a second required distance from the storage device 12 if the two wirings are straight lines which are not parallel with each other; a distance verifying device 22 responsive to a determination result by the determining device 18 for verifying the distance between the two straight lines by using the first required distance or the second required distance; and a display unit 24 for displaying a result of verification in a visually recognizable manner, based on an output from the distance verifying device 22.

Figure 1:
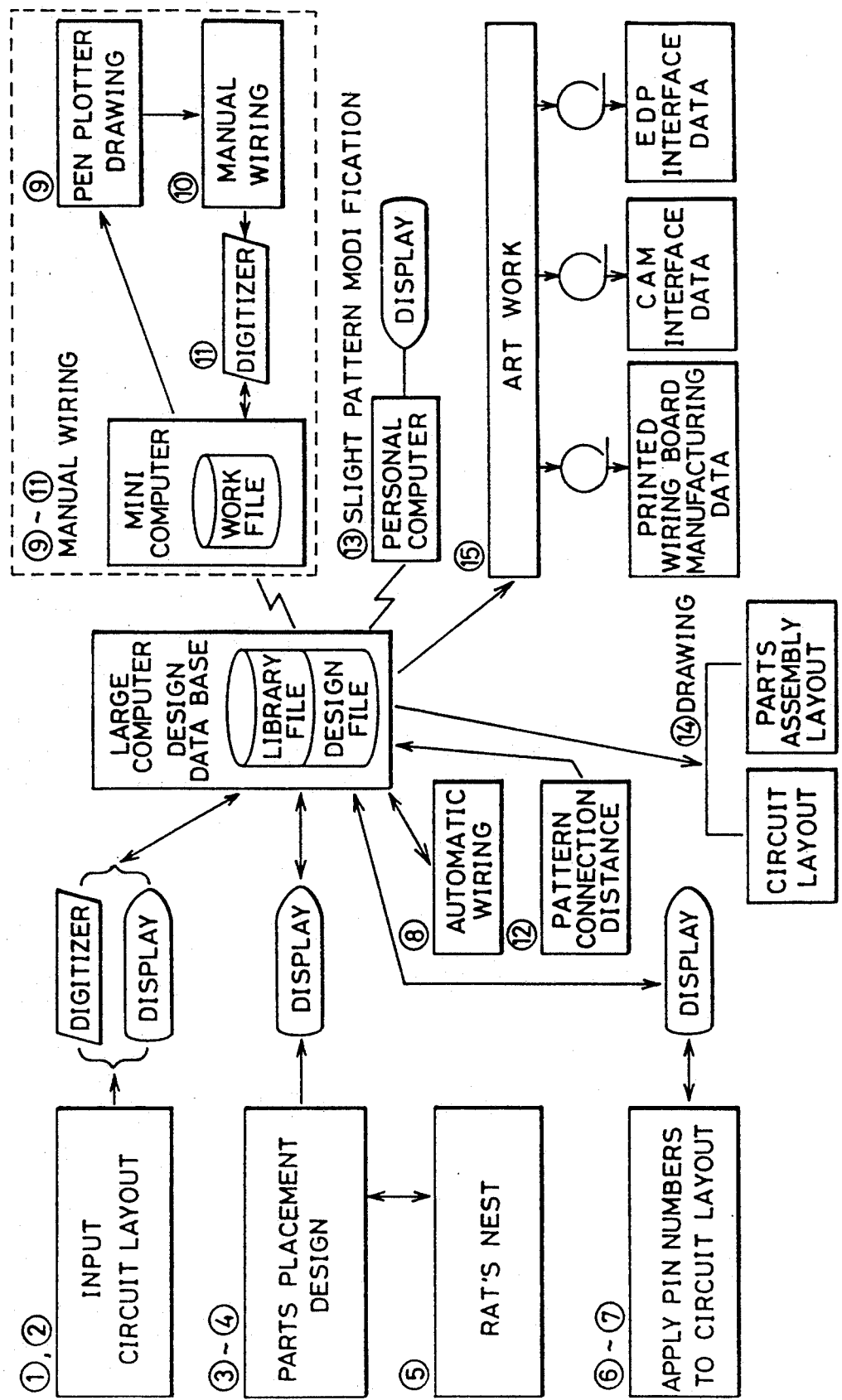
FIG. 1 is a concept diagram showing each process performed by a general CAD system.
Figure 2:
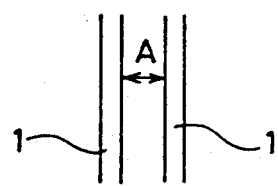
FIGS. 2 to 7 are diagrams each showing the positional relation of a conductor pattern on a CAD screen.
Figure 3:
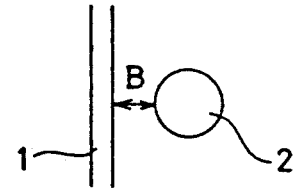
Figure 4:
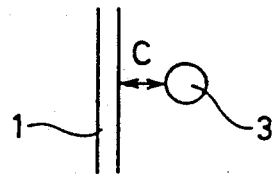
Figure 5:
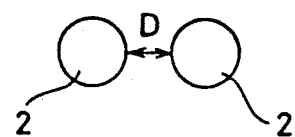
Figure 6:
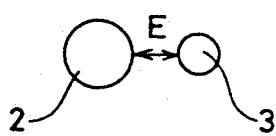
Figure 7:
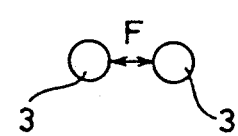

The apparatus shown in FIG. 12 operates as follows. Graphic data to be verified is previously stored in the graphic data storage device 20. Before verification is initiated, the distance verifying device 22 displays the graphic data to be verified on the display unit 24. The figures are displayed on a lattice- called a basic lattice as shown in FIG. 1. The placement of parts and wirings is performed by specifying each lattice point of the basic lattice. Spacings in the basic lattice are therefore closely related with design rules.

Figure 13:
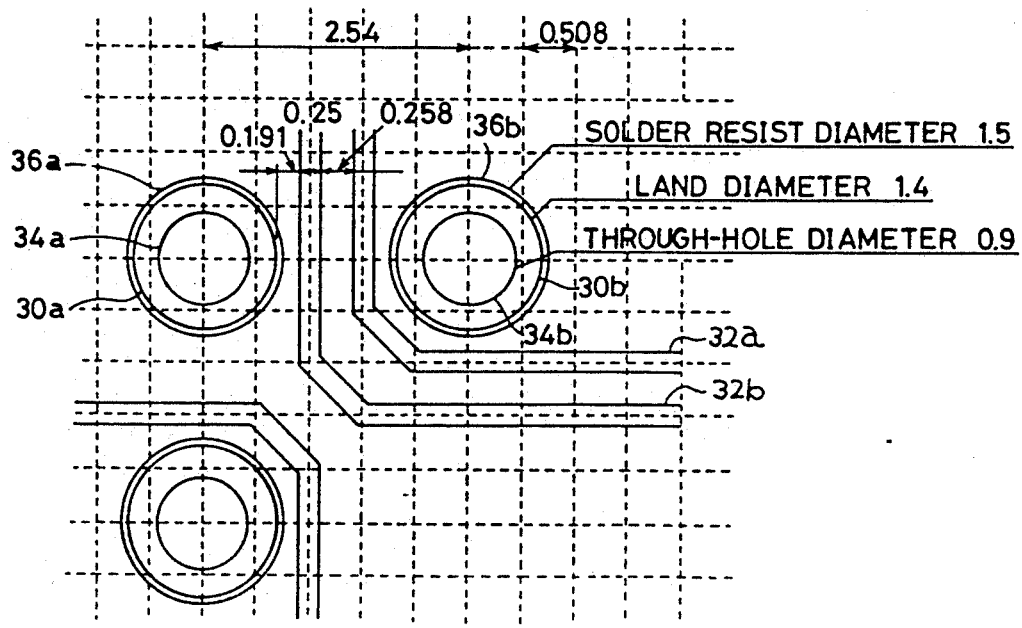
FIG. 13 is a diagram schematically showing an example of a CAD display in accordance with a design rule, in which two lines are arranged between two pins.

In the basic lattice shown in FIG. 13, for example, a design rule is employed, in which two straight lines 32a and 32b are placed between two lands 36a and 36b connected with terminals, which are each called a "pin", of an IC (Integrated Circuit) (not shown) placed on a printed wiring board. In the above case, the distance between lattice points corresponds to one fifth of a tenth of one inch, i.e. 0.508 mm. In a typical use of the basic lattice, a line-land required distance is set to 0.191 mm, and a required distance between two parallel straight lines is set to be 0.258 mm. Each diameter of lands 30a and 30b to which the pins of the IC are connected is selected to be 1.4 mm, each diameter of through-holes 34a and 34b formed on the board for connecting the pins is selected to be 0.9 mm, and each diameter of solder resist 36a and 36b applied onto the lands for protection thereof is selected to be 1.5 mm.

Figure 8:
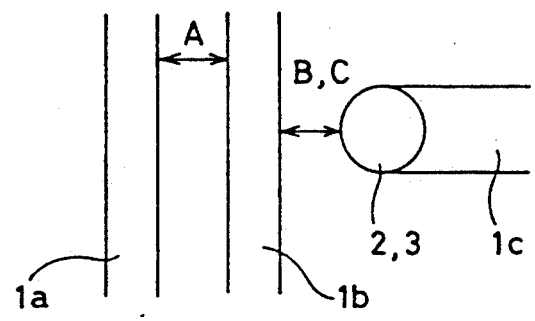
FIGS. 8 to 11 are diagrams each showing a conductor pattern which may give rise to a problem in a conventional method.

As can be seen from FIG. 13, the line-land required distance (0.191 mm) is smaller than the line-line required distance (0.258 mm). Therefore, in the placement in accordance with the conventional method as shown in FIG. 8, the distance B (C) of 0.191 mm between the straight line 1b and the land 2 (or the through-hole 3) is determined to be an error because it is below the required distance 0.258 mm between the straight lines upon verification of the distance between the straight line 1c and the straight line 1b. In the placement as shown in FIG. 8, the straight line 1c and the straight line 1b are in the same relation as that of the line-land relation and are placed at the closest to each other at only one point. It is therefore sufficient only to check the line-land relation, and the distance therebetween does not have to be more than 0.258 mm. Nevertheless, the placement in FIG. 8 has been determined to be an error in accordance with the conventional method.

In contrast, in an apparatus shown in FIG. 12, which employs a method in accordance with an embodiment of the present invention, the determining device 18 first determines whether a set of data read out from the graphic data storage device 20 are of straight lines parallel to each other or not. The operator previously inputs through the input device 10 a first required distance for verifying the relation between straight lines parallel to each other and a second required distance for verifying the relation between straight lines that are not parallel to each other. The determining device 18 operates the first required distance read out device 14 if the two straight lines are parallel to each other as a result of the determination, and otherwise operates the second required distance read out device 16, respectively, so that the first required distance or the second required distance is read out from the storage device 12.

The distance verifying device 22 verifies the distance between the two straight lines to be checked from the data stored in the graphic data storage device 20, by using the required distance supplied from the first required distance read out device 14 if the two straight lines to be checked are parallel to each other, and otherwise by using the required distance supplied from the second required distance read out device 16.

More specifically, referring to FIG. 8, if a line 1b having the same width as the diameter of a land 2 (or a through-hole 3), exists that is connected with the land 2 (or the through-hole 3) and extends away from a straight line 1b, the second required distance is utilized as a reference because the lines 1b and 1c are not parallel to each other. In this case, the distance between the lines 1b and 1b being 0.191 mm is not determined as an error by previously storing in the storage device 12 the same value as the required distance between line-land as the second required distance. Consequently, the problem in the conventional method that an unnecessary verification of errors prevents checking of true errors can be prevented. In the above case, even though the same value as the required distance between line-land is used as a second required distance, other values may be used.

Figure 9:
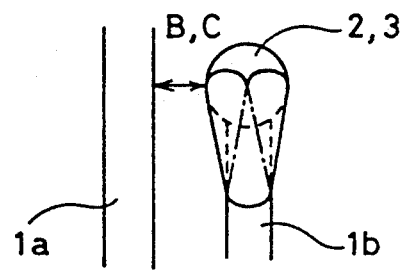
Figure 10:
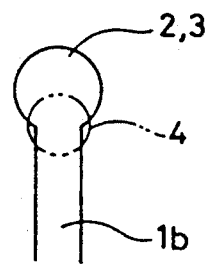
Figure 11:
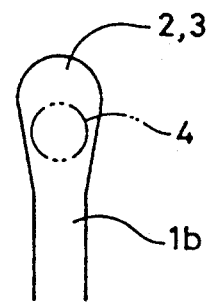

The distance verification between the straight lines 1a and 1c shown in FIG. 9 can be conducted in the same manner as the placement shown in FIG. 8.

Figure 14:
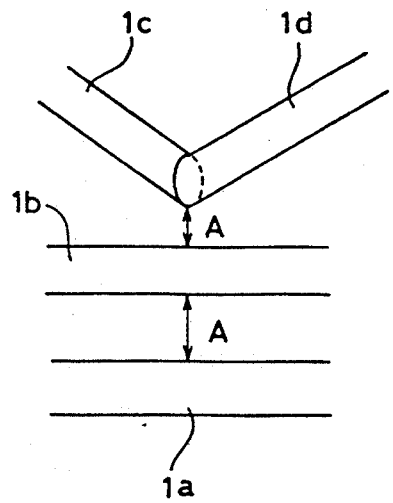
FIG. 14 is a diagram schematically showing a display of a conductor pattern.

Similarly, the placement shown in FIG. 14 conventionally includes the following problem In FIG. 1, the distance between a line 1a and a line 1b should be more than the required line-line distance A. Similarly, the distances between the line 1b and a line 1c, and the line 1b and, a line 1d are each conventionally determined to be an error if they are not more than the required distance A. In practice, however, as shown in FIG. 14, the lines 1c and 1d are most closely located to the line 1b at a single point. The line-land value should therefore be employed as the required distance in this case.

Referring to FIG. 8, the required distance B between line-land is assumed to be smaller than the required distance A between line-line. In the case shown in FIG. 14, the required distance between each of the lines 1c and 1d and, the line 1b can be a value B smaller than the distance A. Nevertheless, in accordance with the conventional method, if the distance between each of the lines 1cand 1d and the line 1b is smaller than the required line-line distance A, the relation has been determined to be an error. Unnecessary errors as such are numerously displayed on a screen, and, therefore, it has been impossible to increase wiring density as high as possible while checking distances accurately.

In accordance with the embodiments of the present invention, however, the most efficient distance checking can be conducted in line placements as shown in FIG. 14 by the following procedure. For example, checking the relation between the line 1c and the line 1b is initiated by determining whether these lines are parallel to each other or not. The required line-line distance A if the lines are determined to be parallel to each other, and the required distance between non-parallel lines if determined to be non-parallel, are each used as a reference value for comparison.

If the required line-land distance B is smaller than the required line-line distance A, the distance B is usually sufficient even when the two lines are not parallel to each other. In this case, the required distance between the lines 1b and 1c is not A but B is smaller than A. Therefore, unnecessary error displays are eliminated for allowing high-density wirings to be designed. In other words, in the placements shown in FIG. 14, distance checking between high-density wirings can be readily conducted by selecting a minimum value confirmed to be the required distance between the two lines which are not parallel to each other and by storing the value in the storage device.

Figure 15:
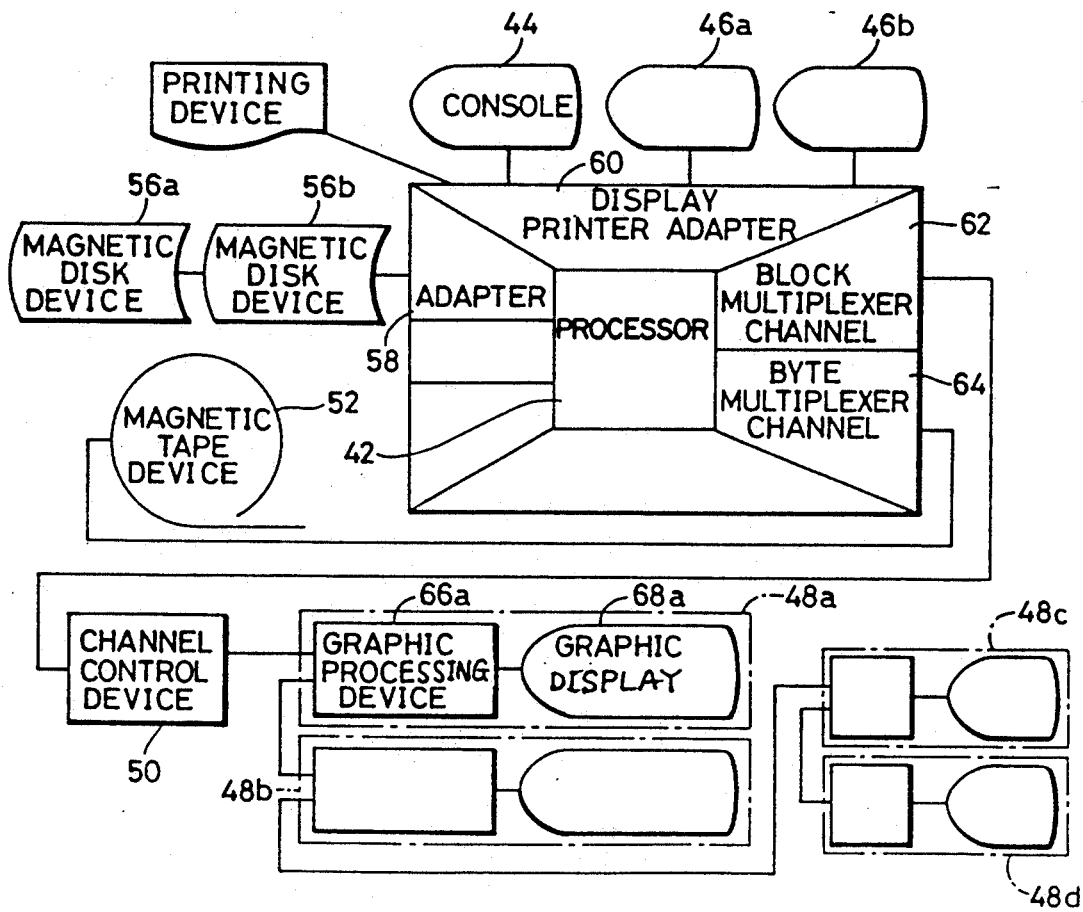
FIG. 15 is a block diagram showing a CAD apparatus utilizing a computer (a processor) for an embodiment of a method in accordance with the present invention.

In practice, a CAD which employs such a method is implemented by software on a computer as well as peripheral equipments. FIG. 15 shows one example of a structure of such a CAD apparatus. Referring to FIG. 15, the apparatus includes: a processor 42 having an operation device, a control device, and a memory; two large-capacity magnetic disk devices 56a, 56b connected to the processor 42 through a DASD (Direct Access Storage Device) adapter 58; a printing device 54 including a printer, a plotter, etc. connected to the processor 42 through a display/printer adapter 60; a console display 44 connected to the processor 42 through the display/printer adapter 60; character displays 46a, 46b connected to the processor 42 through the adapter 60; a plurality of graphic terminals 48a to 48d connected to the processor 42 through a block multiplexer channel 62 and a channel control device 50; and a magnetic tape device 52 connected to the processor 42 through a byte multiplexer channel 64.

The graphic terminal 48a, for example, includes a graphic processing device 66a connected to the channel control device 50, and a graphic display 68a for displaying graphic data. The graphic data to be displayed on the graphic terminals 48a to 48d includes a huge amount of data. A large-capacity data transfer path by the block multiplexer channel 62 and the channel control device 50 is, therefore, formed between the graphic terminals 48a to 48d and the processor 42.

The magnetic disk devices 56a and 56b are for storing graphic data, CAD programs, etc. As mentioned, the graphic data includes a huge amount of data, and, therefore, the magnetic disk devices 56a and 56b must have large capacities.

The magnetic tape device 52 is used mainly for backing up data and for exchanging data with the external system.

Figure 16:
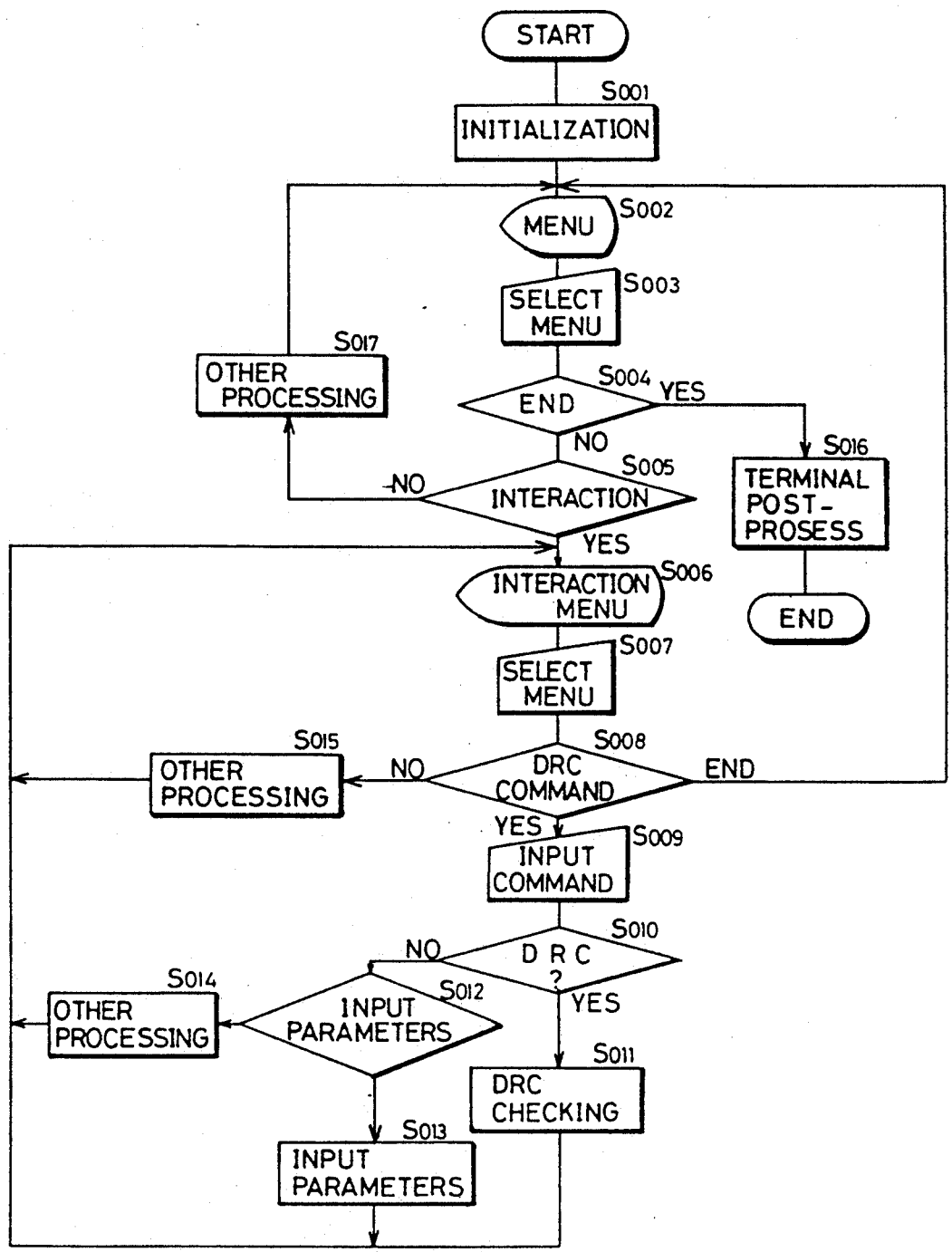
FIGS. 16 to 18 are flow charts each showing a program for implementing a method in accordance with embodiments of the present invention.
Figure 17:
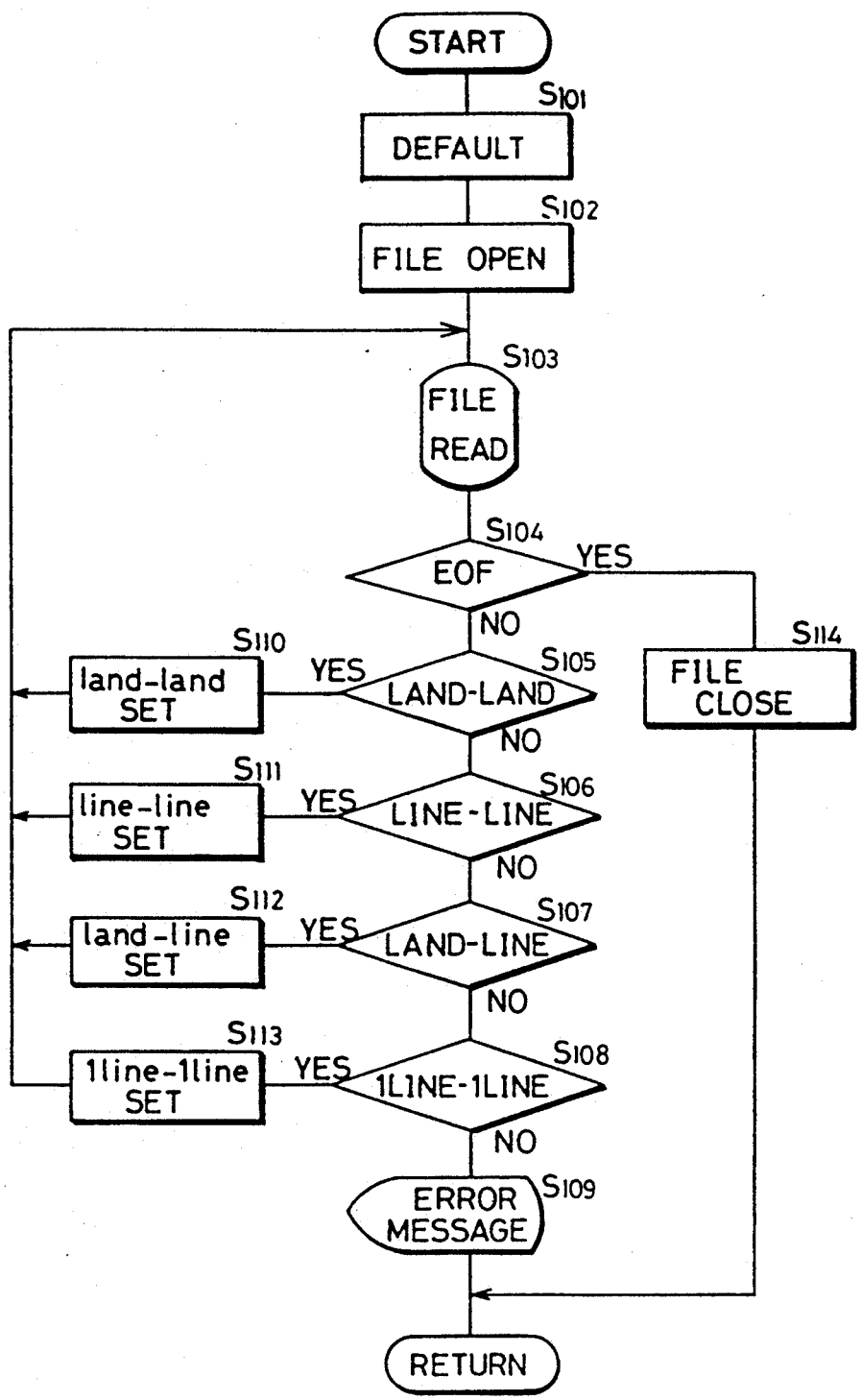
Figure 18:
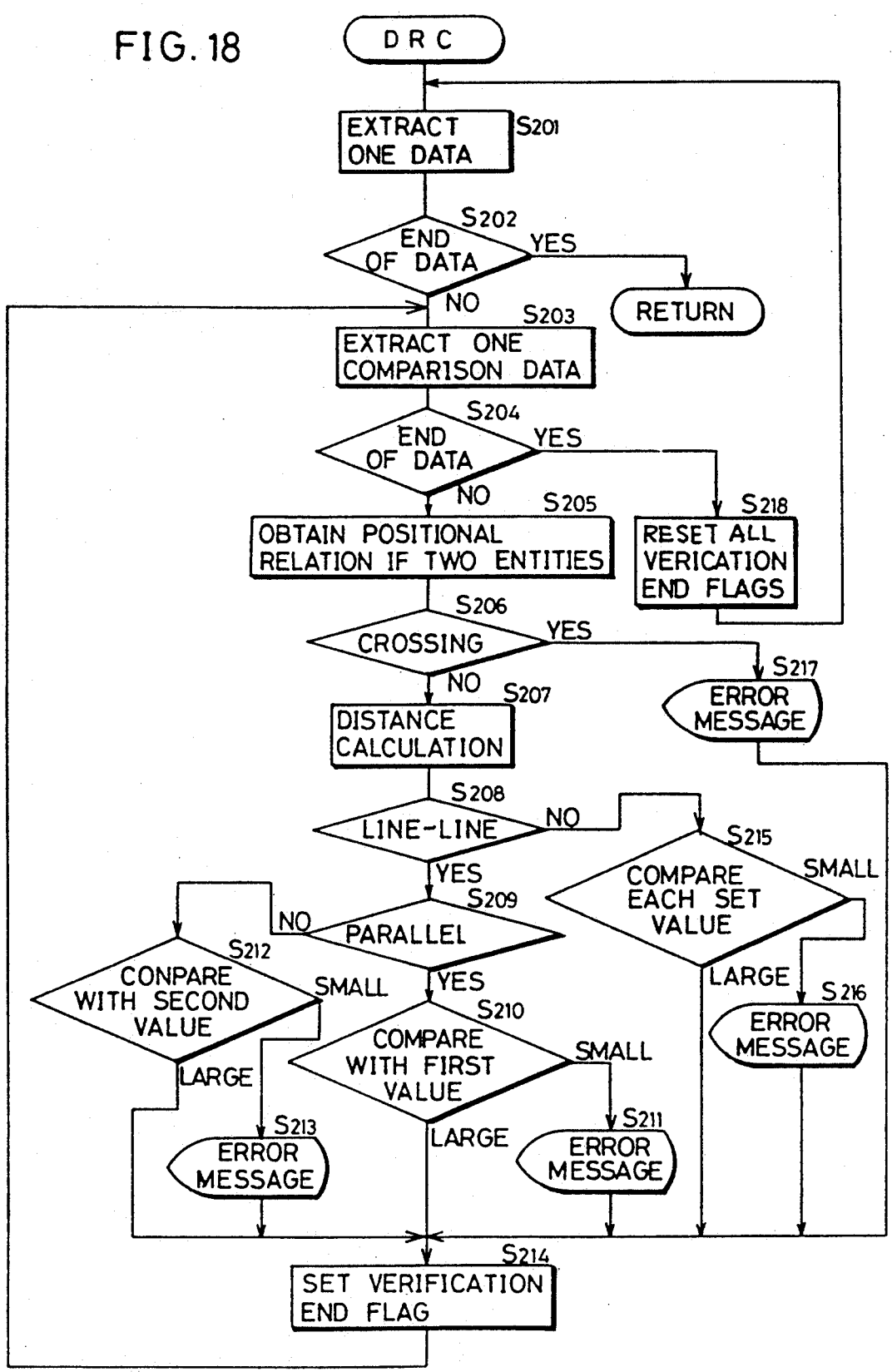

FIGS. 16 to 18 are flow charts each showing key parts of a program operating on the processor 42. Referring to FIG. 16, the main program of CAD programs operating on the processor 42 has a control structure as follows. In step S001, necessary initialization processing is performed.

In step S002, a menu representing selective processings is displayed on a display device.

In step S003, the operator selects a processing.

In step S004, it is determined whether the selected processing indicates "end" or not. If the result of the determination is YES, the control proceeds to step S016, and if the determination is NO, the control proceeds to step S005.

In step S016, necessary terminating process of a terminal is performed, and the program stops running.

In step S005, it is determined whether the processing selected by the operator is of an interactive mode between the operator and the CAD programs or not. If the result of, determination is NO, the control proceeds to step S017, and if the determination is YES, the control proceeds to step S006.

In step S017, the processing selected by the operator is performed, and the control once again returns to step S002.

In step S006, a menu for interaction is displayed on the display device.

In step S007, the operator selects a desired processing.

In step S008, it is determined whether the operator-selected processing is a command for checking the distance relation between data (DRC command) or not. If the result of the determination is YES, the control proceeds to step S009. If the selected menu represents any other processing., the control proceeds to step S015. If the selected processing represents the end of the interaction menu, the control returns to S002.

If the processing other than the DRC command is selected, the processing is executed in step S015, and the control once again returns to step S006.

When the control proceeds from step S008 to step S009, a command for executing a processing desired by the operator is input in step S009.

In step S010, it is determined whether the input command indicates a DRC processing or not. If the result of the determination is YES, the control proceeds to step S011, and if the determination is NO, the control proceeds to step S012.

In step S011, a program for DRC checking, which will be described later, is executed. The result of the execution is displayed, and the control once again returns to step S006 after the operator executes necessary processings.

When the control proceeds from step S010 to step S012, it is determined whether the command input by the operator in step S009 is a command for inputting parameters for checking distances (a first required distance, a second required distance and other required distances) etc. or not. If the result of the determination is YES,, the control proceeds to step S013, and if the determination is NO, the control proceeds to step S014.

In step S013, a processing is performed for reading out from a file prepared in the magnetic disks 56a and 56b (see FIG. 15) the parameters necessary for checking distances (the above-described required distances, etc.). After the reading of the parameters, the control returns to step S006.

In step S014, a processing selected by the operator other than inputting the parameters is executed. The control returns to step S006 thereafter.

The program executed in step S011 is, for checking whether the distance between wirings of the graphic data is conducted in accordance with a prescribed rule. The program executed in step S013 is a processing for setting a reference value for the distance checking to be conducted in step S011. Programs for implementing each of these processings will be described later on.

FIG. 17 is a flow chart schematically showing a subroutine program executed in step S013 in FIG. 16. As described above, the subroutine program is for setting parameters such as the required line-line distance, the required land-line distance, the required distance between two non-parallel lines, and the required distance between two other arbitrary wirings.

In step S101, a default value is set for each required distance in the program. The default value is previously set in accordance with a general design rule when the program is produced. Unless changed in processings which will be described later, the default value is used as a reference value for distance checking.

In step S110, a file for storing parameters prepared for each user is opened. The file can be prepared for each user by giving it, for example, a fixed name. The default value set in step S101 can therefore be changed into another value commonly used by each user. The file includes one or a plurality of records, one record including, for example, a pair of a value representing the distance required between wirings and a code representing what kind of pair of wirings the required distance is applied to. The file opened in step S102 may be the one having a previously fixed name in the flow chart shown in FIG. 17, or the operator may input the name of the file immediately before step S102. In the latter case, required distances can be previously set which are highly applicable to what is to be designed.

In step S103, one record from the file opened in step S102 is read out.

In step S104, it is determined whether the end of the file (EOF) is reached or not. If the result of the determination is YES, the control proceeds to step S114, and if the termination is NO, the control proceeds to step S105.

In step S114, the file is closed, and other necessary processings are executed so that the subroutine program is completed.

In step S105, it is determined whether the code of the record read out is the one allotted for the required distance between land-land or not. If the result of the determination is YES, the control proceeds to step S110, and if the determination is NO, the control proceeds to step S106.

In step S110, the value of the required distance in the read out record is stored in a prescribed storage area as the required distance to be applied to land-land relation in the program.

In step S106, it is determined whether the code of the read out record is a value allotted for a line-line combination or not. If the result of the determination is YES, the control proceeds to step S111, and if the determination is NO, the control proceeds to step S107.

In step S111, the value in the field of "required distance" of the read out record is stored into a prescribed storage area as the required distance value for the line-line combination in the program.

In step S107, it is determined whether or not the code of the read out record is a value allocated for a land-land combination. If the result, of the determination is YES, the control proceeds to step S112, and the determination is NO, the control proceeds to step S108.

In step S111, the value of the field of "clearance distance" of the read out record is stored into a prescribed storage area as the required distance between land-line.

In step S108, it is determined whether the code of the read out record is a value allotted for a combination of two non-parallel lines (referred to as "1 LINE- 1 LINE") or not. If the result of the, determination is YES, the control proceeds to step S113, and if the determination is NO, the control proceeds to step S109.

In step S113, the value of the field of "required distance" of the read out record is stored in a prescribed storage area as the value of the required distance between the two lines which are parallel to each other.

In step S109, the code of the read out record does not coincide any of the previously provided codes, and, therefore, an error message is displayed. In this case, as in the processing in S114, the file is closed and the subroutine program is completed.

When the processings in steps S110, S111, S112, and S113 are completed, the control returns to step S103 in any of the above cases, and the next record is to be read out.

It should be noted that although the processings are executed for setting reference values for checking the required distances between land-land, line-line, land-line and two non-parallel lines in FIG. 17, and other combinations are conceivable as required distance values. In other words, combinations of a through-hole and a through-hole, a through-hole and a line, or a through-hole and a land are possible. In each case, a determination is made on these combinations between steps S108 and S109, and necessary processings are executed for providing processings to return the control to step S103.

If a record, which has a value written representing the required distance for a prescribed combination of wirings is found in the file by executing the processings from step S103 to step S114, the default value set in step S101 is replaced by the value read out from the file.

FIG. 18 is a flow chart schematically showing a subroutine program (DRC program) for checking the distance between wirings.

In step S201, one piece of wiring data is extracted from the memory.

In step S202, it is determined if the wiring data comes to its end or not. In other words, it is determined whether the data extracted in step S201 reaches the end. If the result of the determination is YES, the subroutine program is completed. If the result of the determination is NO, the control proceeds to step S203.

In step S203, another piece of data is extracted from the memory for comparison with the extracted data in step S201.

In step S204, it is determined whether the data of the processing to be read out in step S203 has reached the end or not. If the result of the determination is YES, the control proceeds to step S218 and if the determination is NO, the control proceeds to step S205.

In step S205, a processing is conducted for determining the positional relation between the two pieces of data (two entities) extracted in steps S201 and S203.

In step S206, it is determined whether or not the result indicating that the two entities cross each other is obtained as a result of the processing in step S205. If the result of the determination is YES, the control proceeds to step S217, and if the determination is NO, the control proceeds to step S207.

In step S217, an error message and/or an error location will be displayed, because the two wirings which should not cross each other are determined to have crossed each other. For example, the display of the two wirings being checked from the displayed graphic data will be switched to a red color display. The control hereinafter proceeds to step S214.

In step S207, the calculation of the distance between the two entities will be carried out. Methods of a distance calculation are well known, and therefore a detailed description thereof will not be given here. Then, the control proceeds to step S208.

In step S208, it is determined whether the two entities being checked are in the line-line relation or not. If the result of the determination is YES, the control proceeds to step S209, and if the determination is NO, the control proceeds to step S215.

In step S215, it is determined whether the distance between the two entities is equal to or larger than the required distance previously set in a similar manner to conventional methods. If the resultant distance of the determination is larger than the set value, the control proceeds to step S214, and if the determination is not larger than the set value, the control proceeds to step S216.

In step S216, the distance between the two entities is smaller than the set value and, therefore, the distance is determined to be an error in designing, so that an error message is displayed or the color of the display in the wiring parts in question is changed. The control thereafter proceeds to step S214.

In step S209, it is determined whether the two lines being checked are parallel to each other or not. The determination of the lines being parallel or not is conducted by examining whether two straight lines extending from the two lines cross each other or not. If for example, the two straight lines are parallel to each other, simultaneous equations of the first degree with two unknowns consisting of two equations representing these two straight lines have no solution. In contrast, if the two straight lines cross each other, the simultaneous equations of the first degree with two unknowns have a solution. In other words, the determination in step S209 is conducted in accordance with an algebraic method, and the method itself is well known. Therefore, a detailed description thereof will not be repeated here. If the result of the determination in step S209 is YES, the control proceeds to step S210, and if the determination in step 209 is NO, the control proceeds to step S210.

In step S210, a comparison is made between the first required distance and the distance between the two lines, because the two lines are parallel to each other. If a determination is made that the distance between the two lines is larger, the control proceeds to step S214, and if a determination is made that the distance between the two lines is not larger, the control proceeds to step S211.

In step S211, an error message is displayed or the color of display of the lines in question is changed, because the distance between the two parallel lines is smaller than the set value. Then, the control proceeds to step S214.

If the control proceeds from step S209 to step S211, in step S221, a comparison is conducted between the distance between the two lines and the second required distance. If the distance between the two lines is larger than the second required distance as a result of the comparison, the control proceeds to step S214, and if the distance between the two lines is not larger than the second required distance, the control proceeds to step S213.

In step S213, an error message indicating that the relation does not satisfy the design rule is displayed or the color of the display in the wirings in question is changed, because the distance between the two lines which are not parallel to each other is smaller than the preset value.

In step S214, a value indicating that the verification is over is set at a verification end flag indicative of whether the verification on the combination of the entity extracted in step S201 and the entity extracted in step S203 is completed or not. Then, the control once again returns to step S203. Thereafter, the processings from step S203 to step S214 are repeated, with respect to all the data to be checked. When the comparison of all the data to be compared is completed, the control proceeds to step S218.

In step S218, the verification end flags set in step S214 are all reset The control thereafter returns to step S201. The repetition of a verification as to an identical combination can be avoided by setting a verification end flag to a specified combination of entities in step S214. By resetting all of the verification end flags in step S218, the preparation of a verification end flag for every combination for all of the data and all of the comparison data can be avoided. However, a verification end flag does not have to be used only in this manner. For example, by extracting data sequentially from the upper right of the image in accordance with coordinates allotted for the graphic data, the repetition of the verification as to identical combinations can be avoided without using the verification end flags. By using the flags as shown in FIG. 18, however, the repetition of the verification as to identical combinations can be readily avoided, and, moreover, the completion of the verification can be readily confirmed.

By using CAD software including programs having control structures as shown in FIGS. 16 to 18, it is easily determined whether the distance between two non-parallel straight lines is more than a prescribed minimum required value or not as mentioned above, and it is also easily determined whether the distance therebetween is necessarily large or not. The two lines, which are not parallel to each other and are placed apart at a distance larger than a minimum required value, will not be determined to be an error unnecessarily, only because these lines are placed at a distance shorter than the distance required between two straight lines parallel to each other. Therefore, a large number of such unnecessary errors will not be displayed on a screen, and only the errors- which truly, require modifications will be displayed. An accurate distance checking is therefore readily performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of verifying a wiring layout, comprising the steps of:
    (a) preparing wiring layout data which includes a plurality of types of wiring elements including straight wiring;
    (b) preparing a first reference value representing a first minimum required distance in the wiring layout for each combination of two arbitrary types of third wiring elements;
    (c) preparing a second reference value representing a second minimum required distance between two straight wirings of the wiring elements in a predetermined positional relation on the wiring layout;
    (d) extracting two arbitrary types of said wiring elements from said wiring layout data;
    (e) determining the combination of said two arbitrary types of wiring elements extracted at said step (d);
    (f) determining whether said two straight wirings are in said predetermined positional relation on the wiring layout if said two arbitrary types of wiring elements extracted at said step (d) are both determined to be straight wirings in said step (e);
    (g) determining whether a predetermined relation can be established between said first or second reference value and the distance between said two arbitrary types of wiring elements extracted at said step (d) by comparing the distance between said two arbitrary types of wiring elements with said second reference value if said two arbitrary types of wiring elements are both determined to be straight wirings in said predetermined positional relation with each other in said step (f), and otherwise comparing said two arbitrary types of wiring elements extracted at said step (d) with said first reference value; and
    (h) displaying information for specifying said two arbitrary types of wiring elements extracted at said step (d) if said predetermined positional relation is determined to be established in said step (g).

2. The method of verifying the wiring layout in accordance with claim 1, wherein said predetermined positional relation is established when said two straight arbitrary types of wiring elements extracted at said step (d) are wirings parallel to each other on the wiring layout.

3. The method of verifying the wiring layout in accordance with claim 1, wherein said predetermined positional relation is established when the distance between said two arbitrary types of wiring elements extracted at said step (d) is smaller than said first reference value and said second reference value.

4. The method of verifying the wiring layout in accordance with claim 1, further comprising the step of repeating said steps (d)-(h) for every pair of said wiring elements.

5. The method of verifying the wiring layout in accordance with claim 1, wherein said first reference value for said two straight wirings is larger than said second reference value.

6. The method of verifying the wiring layout in accordance with claim 1, wherein said first reference value for said two straight wirings is smaller than said second reference value.

7. An apparatus for verifying a wiring layout, comprising:
inputting means for inputting wiring layout data which includes a plurality of types of wiring elements including straight wiring;
wiring layout data storage means for storing data input at said inputting means including,
a first area for storing a first reference value representing a first minimum required distance in the wiring layout for each combination of two arbitrary types of the wiring elements,
a second area for storing a second reference value representing a second minimum required distance between two straight wirings of the wiring elements in a predetermined positional relation on the wiring layout, and
a third area for storing required distances for other types of the wiring elements;
graphic data storage means for storing graphic data including wiring elements to be checked;
determining means for extracting two arbitrary types of said wiring elements from said wiring layout data and a determining whether said two arbitrary types of said wiring elements are parallel to each other;
first required distance reading means for reading out said first minimum required distance from said wiring layout data storage means if said two arbitrary types of said wiring elements are determined to be parallel to each other by said determining means;
second required distance reading means for reading gout said second minimum required distance from said wiring layout data storage means if said two arbitrary types of said wiring elements are determined as failing to be parallel with each other;
distance verifying means for verifying the distance between said two straight wirings of said wiring elements by using said first or second minimum required distance in response to said determining means; and
display means for displaying a result of the verification by said distance verifying means.

8. The apparatus for verifying the wiring layout in accordance with claim 7, wherein said determining means determines whether a predetermined relation is established between said first or second reference value and the distance between said two arbitrary types of wiring elements by comparing the distance between said two arbitrary types of wiring elements with said second reference value if said two arbitrary types of wiring elements are both determined to be straight wirings with respect to each other to establish a predetermined positional relation and otherwise comparing said two arbitrary types of wiring elements with said first reference value.

9. The apparatus for verifying the wiring layout in accordance with claim 8, wherein said predetermined positional relation is established by said determining means when said two arbitrary types of wiring elements are two straight wirings parallel to each other on the wiring layout.

10. The apparatus for verifying the wiring layout in accordance with claim 8, wherein said predetermined positional relation is established by said determining means when the distance between said two arbitrary types of wiring elements is smaller than said first reference value or said second reference value.

11. The apparatus for verifying the wiring layout in accordance with claim 7, wherein said first reference value for said two straight wirings is larger than said second reference value.

12. The apparatus for verifying the wiring layout in accordance with claim 1, wherein said first reference value for said two straight wirings is smaller than said second reference value.

* * * * *